United States Patent
Luo

(10) Patent No.: US 10,672,839 B2
(45) Date of Patent: Jun. 2, 2020

(54) TOUCH SYSTEM, ACTIVE MATRIX ORGANIC LIGHT EMITTING DIODE PANEL, AND DISPLAY DRIVING METHOD

(71) Applicant: Huawei Technologies Co., Ltd., Shenzhen (CN)

(72) Inventor: Honglei Luo, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/571,452

(22) PCT Filed: May 11, 2015

(86) PCT No.: PCT/CN2015/078657
§ 371 (c)(1),
(2) Date: Nov. 2, 2017

(87) PCT Pub. No.: WO2016/179778
PCT Pub. Date: Nov. 17, 2016

(65) Prior Publication Data
US 2018/0138246 A1 May 17, 2018

(51) Int. Cl.
*H01L 27/32* (2006.01)
*G06F 1/16* (2006.01)
(Continued)

(52) U.S. Cl.
CPC .......... *H01L 27/323* (2013.01); *G06F 1/1643* (2013.01); *G06F 3/041* (2013.01);
(Continued)

(58) Field of Classification Search
CPC ......... G06F 3/0412; G06F 2203/04103; G06F 3/0416; G06F 3/0488; G02F 1/133528;
(Continued)

(56) References Cited

U.S. PATENT DOCUMENTS 9,164,641 B1 * 10/2015 Rowe ...................... G06F 3/044
9,652,091 B1 * 5/2017 Obeidat .................. G06F 3/044
(Continued)

FOREIGN PATENT DOCUMENTS

CN 102736287 A 10/2012
CN 102738199 A 10/2012
(Continued)

OTHER PUBLICATIONS

Foreign Communication From a Counterpart Application, European Application No. 15891481.2, Extended European Search Report dated Apr. 10, 2018, 12 pages.
(Continued)

*Primary Examiner* — Gerald Johnson
(74) *Attorney, Agent, or Firm* — Conley Rose, P.C.

(57) ABSTRACT

A touch system includes a glass cover, a polarizer, packaging glass, a thin film transistor (TFT) backplane, a transmitter (TX) circuit, and a receiver (RX) circuit, where the glass cover, the polarizer, the packaging glass, and the TFT backplane are fitted in sequence from top to bottom, and the TX circuit is located on the TFT backplane, and the RX circuit is located on the packaging glass. The TX circuit and the RX circuit are respectively disposed on the TFT backplane and the packaging glass. Therefore, a quantity of stacked layers of the touch control system is reduced. This reduces a thickness of the touch system, thereby achieving a thinner and lighter active matrix organic light emitting diode (AMOLED) display screen, and reducing a weight of a terminal product.

20 Claims, 5 Drawing Sheets

(51) Int. Cl.
*G06F 3/041* (2006.01)
*G06F 3/044* (2006.01)
*G09G 3/3225* (2016.01)
*G09G 3/3266* (2016.01)
*H01L 51/52* (2006.01)

(52) U.S. Cl.
CPC ............ *G06F 3/044* (2013.01); *G06F 3/0412* (2013.01); *G06F 3/0416* (2013.01); *G09G 3/3225* (2013.01); *G09G 3/3266* (2013.01); *H01L 27/3276* (2013.01); *H01L 51/5225* (2013.01)

(58) Field of Classification Search
CPC ..... G02F 1/13454; G02F 2001/133331; H01L 27/1214; H01L 27/323; H01L 2251/5338; H01L 51/5221; H01L 51/5293; H01L 27/3225; H01L 27/3244; H01L 27/3258; H01L 27/3262; G02B 6/0073; G09G 3/3433; G09G 2330/021; G09G 2360/144; G09G 3/346; G09G 2310/0262; G09G 2320/0666
See application file for complete search history.

(56) References Cited

U.S. PATENT DOCUMENTS

| | | |
|---|---|---|
| 2009/0128545 A1 | 5/2009 | Lee et al. |
| 2010/0295861 A1* | 11/2010 | Somerville .......... G09G 3/3216 345/545 |
| 2010/0315570 A1 | 12/2010 | Mathew et al. |
| 2011/0193817 A1 | 8/2011 | Byun et al. |
| 2012/0249454 A1 | 10/2012 | Teraguchi et al. |
| 2013/0188305 A1* | 7/2013 | Mathew ................ G06F 1/1637 361/679.27 |
| 2013/0314361 A1 | 11/2013 | Saitoh et al. |
| 2014/0022185 A1 | 1/2014 | Ribeiro et al. |
| 2014/0049508 A1 | 2/2014 | Kim et al. |
| 2014/0071356 A1 | 3/2014 | Petcavich |
| 2014/0118399 A1* | 5/2014 | Todorovich .......... G06T 3/4038 345/634 |
| 2014/0184522 A1 | 7/2014 | Ma |
| 2014/0326968 A1 | 11/2014 | Lee |
| 2014/0333849 A1 | 11/2014 | Ma et al. |
| 2015/0169094 A1* | 6/2015 | Liu .................... H01L 51/5262 345/173 |
| 2015/0169121 A1* | 6/2015 | Yao ...................... G06F 3/0412 345/174 |
| 2016/0018938 A1 | 1/2016 | Ding et al. |
| 2016/0103513 A1* | 4/2016 | Yang ..................... G06F 3/041 345/175 |
| 2016/0126287 A1* | 5/2016 | Her .................... H01L 27/3276 257/88 |
| 2016/0282984 A1* | 9/2016 | Chang ................. G06F 3/0416 |
| 2016/0363808 A1 | 12/2016 | Zou |
| 2017/0220164 A1 | 8/2017 | Shi et al. |
| 2018/0039374 A1 | 2/2018 | Azumi et al. |

FOREIGN PATENT DOCUMENTS

| | | |
|---|---|---|
| CN | 103299359 A | 9/2013 |
| CN | 103455201 A | 12/2013 |
| CN | 103594050 A | 2/2014 |
| CN | 103941496 A | 7/2014 |
| CN | 103959216 A | 7/2014 |
| CN | 203707133 U | 7/2014 |
| CN | 203746030 U | 7/2014 |
| CN | 203838671 U | 9/2014 |
| CN | 104199578 A | 12/2014 |
| CN | 104393025 A | 3/2015 |
| JP | 2012212076 A | 11/2012 |
| JP | 2015043200 A | 3/2015 |
| KR | 20130084326 A | 7/2013 |
| KR | 20140039848 A | 4/2014 |
| WO | 2012118513 A1 | 9/2012 |
| WO | 2012137800 A1 | 10/2012 |
| WO | 2013063183 A1 | 5/2013 |

OTHER PUBLICATIONS

Foreign Communication From a Counterpart Application, Japanese Application No. 2017-556554, Japanese Office Action dated Sep. 4, 2018, 6 pages.
Foreign Communication From a Counterpart Application, Japanese Application No. 2017-556554, English Translation of Japanese Office Action dated Sep. 4, 2018, 7 pages.
Machine Translation and Abstract of Chinese Publication No. CN102736287, Oct. 17, 2012, 21 pages.
Machine Translation and Abstract of Chinese Publication No. CN203746030, Jul. 30, 2014, 10 pages.
Machine Translation and Abstract of Chinese Publication No. CN203707133, Jul. 9, 2014, 38 pages.
Foreign Communication From a Counterpart Application, PCT Application No. PCT/CN2015/078657, English Translation of International Search Report dated Feb. 2, 2016, 3 pages.
Foreign Communication From a Counterpart Application, PCT Application No. PCT/CN2015/078657, English Translation of Written Opinion dated Feb. 2, 2016, 7 pages.
Foreign Communication From a Counterpart Application, European Application No. 15891481.2, European Office Action dated Jan. 14, 2019, 13 pages.
Foreign Communication From a Counterpart Application, Korean Application No. 10-2017-7030916, Korean Office Action dated Nov. 21, 2018, 4 pages.
Foreign Communication From a Counterpart Application, Korean Application No. 10-2017-7030916, English Translation of Korean Office Action dated Nov. 21, 2018, 3 pages.
Machine Translation and Abstract of Chinese Publication No. CN102738199, Oct. 17, 2012, 38 pages.
Machine Translation and Abstract of Chinese Publication No. CN103299359, Sep. 11, 2013, 25 pages.
Machine Translation and Abstract of Chinese Publication No. CN203838671, Sep. 17, 2014, 9 pages.
Foreign Communication From a Counterpart Application, Chinese Application No. 201580078795.0, Chinese Office Action dated May 8, 2019, 10 pages.
Machine Translation and Abstract of Korean Publication No. KR20140039848, Apr. 2, 2014, 32 pages.
Foreign Communication From a Counterpart Application, Korean Application No. 2019-038472303, Korean Notice of Allowance dated May 29, 2019, 2 pages.
Foreign Communication From a Counterpart Application, Chinese Application No. 201580078795.0, Chinese Office Action dated Oct. 31, 2019, 11 pages.

* cited by examiner

Scan and display one frame row-by-row

Scan and display one frame segment-by-segment

TOUCH SYSTEM, ACTIVE MATRIX ORGANIC LIGHT EMITTING DIODE PANEL, AND DISPLAY DRIVING METHOD

CROSS-REFERENCE TO RELATED APPLICATION

This application is a U.S. National Stage of International Patent Application No. PCT/CN2015/078657 filed on May 11, 2015, which is hereby incorporated by reference in its entirety.

TECHNICAL FIELD

The present disclosure relates to the field of display technologies, and in particular, to a touch control system, an active matrix light emitting diode panel, and a display driving method.

BACKGROUND

Organic light emitting display components are well acknowledged in the industry as a most promising next-generation display technology, and are one of research focuses and hot topics in a optoelectronics field at present. Therefore, an active matrix organic light emitting diode (AMOLED) display screen produced using an AMOLED is used on a high-end smart model because of many advantages such as good picture quality, light weight, and thinness of the display screen.

The AMOLED display screen includes a display screen and a touch control system. Referring to FIG. 1, the touch control system includes a structure of multiple layers, which, from top to bottom, are a glass cover, an independent sensor, a polarizer, packaging glass, and a thin film transistor (TFT) backplane in sequence. A receiver (RX) circuit and a transmitter (TX) circuit are respectively disposed on an upper surface and a lower surface of the independent sensor.

In a process of implementing the present disclosure, the inventor discovers that other approaches have at least the following problems.

Because the touch control system includes a structure of multiple layers and is produced on the display screen, a piece of glass or a material of other texture needs to be prepared independently in order to produce the touch control system. Consequently, the AMOLED display screen is relatively thick, thereby increasing a weight of a terminal product.

SUMMARY

To resolve the problem in the other approaches, embodiments of the present disclosure provide a touch control system, an active matrix light emitting diode panel, and a display driving method. Technical solutions are as follows.

According to a first aspect, a touch control system is provided, where the touch control system includes a glass cover, a polarizer, packaging glass, a TFT backplane, a TX circuit, and an RX circuit, where the glass cover, the polarizer, the packaging glass, and the TFT backplane are fitted in sequence from top to bottom, and the TX circuit is located on the TFT backplane, and the RX circuit is located on the packaging glass.

In a first possible implementation manner of the first aspect, the TFT backplane includes a pixel circuit, where the TX circuit is routed in the pixel circuit in an intercalated manner, and the RX circuit is routed on an upper surface of the packaging glass in an intercalated manner.

With reference to the first aspect, in a second possible implementation manner of the first aspect, the TFT backplane includes a pixel circuit, where the TX circuit is routed in the pixel circuit in an intercalated manner, and the RX circuit is routed on a lower surface of the packaging glass in an intercalated manner.

With reference to the second possible implementation manner of the first aspect, in a third possible implementation manner of the first aspect, the touch control system includes an organic light emitting diode (OLED) cathode layer, where the OLED cathode layer is located on the lower surface of the packaging glass, and the RX circuit is routed in the OLED cathode layer in an intercalated manner.

With reference to the first or second possible implementation manner of the first aspect, in a fourth possible implementation manner of the first aspect, multiple routes of the TX circuit divide a pixel array of the pixel circuit into multiple pixel array blocks.

With reference to the second possible implementation manner of the first aspect, in a fifth possible implementation manner of the first aspect, the RX circuit divides the OLED cathode layer into multiple blocks.

According to a second aspect, an AMOLED panel is provided, where the panel includes the foregoing touch control system, a scan circuit, and a light emission control circuit.

According to a third aspect, a display driving method is provided, where the display driving method is applied to the foregoing AMOLED panel, and the method includes driving, using a scan signal line, a scan circuit to scan multiple rows of the any frame of image in sequence in a display driving process, for any frame of image, and driving, using a light emission control signal line, a light emission control circuit to display the scanned multiple rows.

In a first possible implementation manner of the third aspect, driving, using a scan signal line, a scan circuit to scan multiple rows of the any frame of image in sequence includes controlling, using the scan signal line, the scan circuit to scan the multiple rows of the any frame of image in sequence according to a preset direction.

With reference to the third aspect, in a second possible implementation manner of the third aspect, a touch control response time falls within a scan time of the scan circuit or a light emission control time of the light emission control circuit.

Beneficial effects of the technical solutions provided in the embodiments of the present disclosure are as follows.

A TX circuit and an RX circuit are disposed on a TFT backplane or packaging glass. Therefore, a quantity of stacked layers of a touch control system is reduced. This reduces a thickness of the touch control system, thereby achieving a thinner and lighter AMOLED display screen, and reducing a weight of a terminal product.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the present disclosure clearer, the following further describes the embodiments of the present disclosure in detail with reference to the accompanying drawings.

Figure 1:
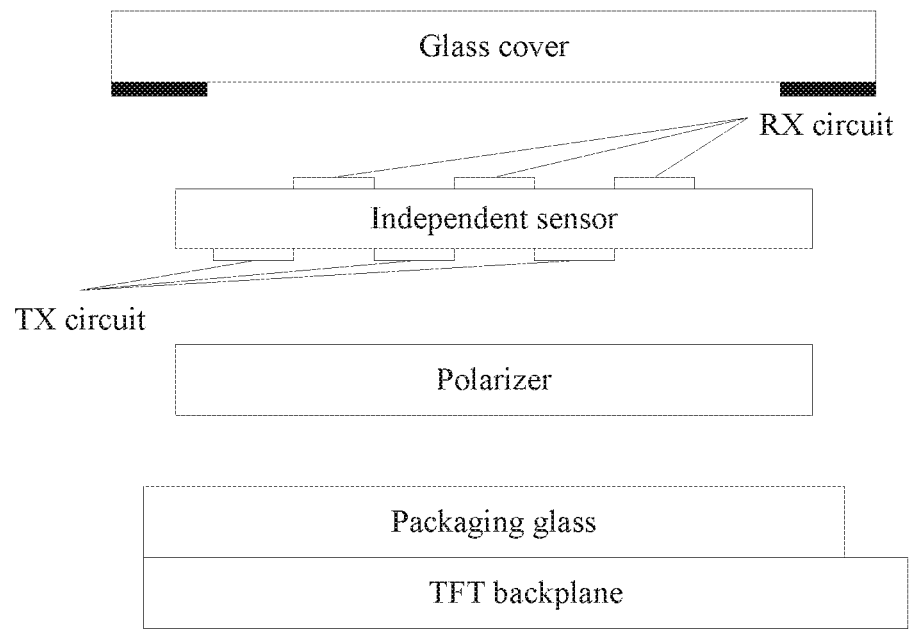
FIG. 1 is a schematic structural diagram of a touch control system in an active matrix light emitting diode panel.
Figure 2:
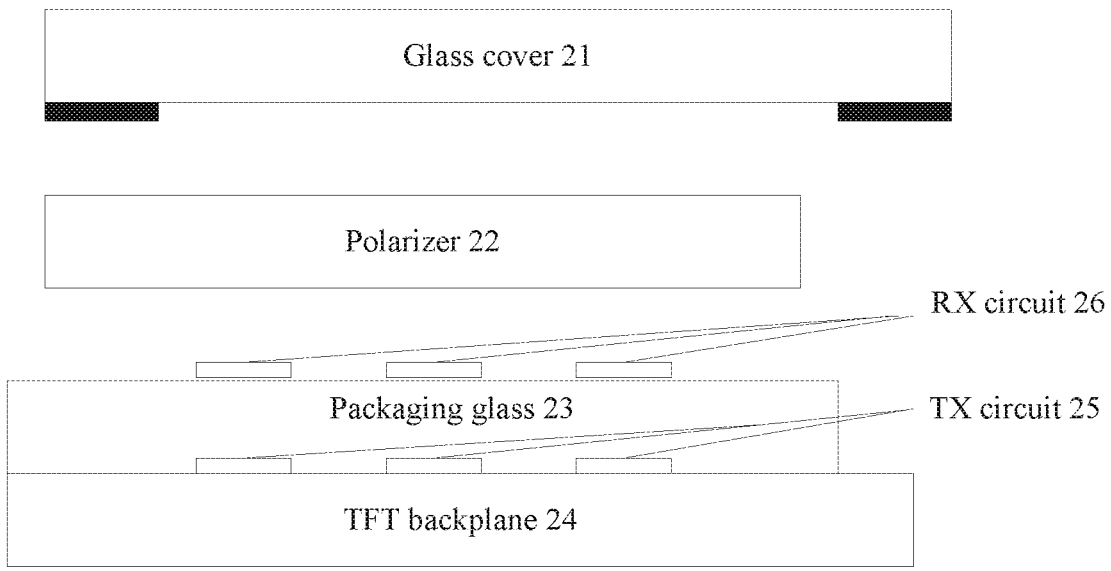
FIG. 2 is a schematic structural diagram of a first type of touch control system in an active matrix light emitting diode panel according to an embodiment of the present disclosure.

FIG. 2 shows a touch control system according to an embodiment of the present disclosure. Referring to FIG. 2, the touch control system includes a glass cover 21, a polarizer 22, packaging glass 23, a TFT backplane 24, a TX circuit 25, and an RX circuit 26.

The glass cover 21, the polarizer 22, the packaging glass 23, and the TFT backplane 24 are fitted in sequence from top to bottom. The TX circuit 25 is located on the TFT backplane 24, and the RX circuit 26 is located on the packaging glass 23.

The TX circuit 25, the packaging glass 23, and the RX circuit 26 form an integrated sensor, which implements functions of a TX circuit, an RX circuit, and an independent sensor in the other approaches. That is, the independent sensor is omitted while original functions can be implemented. This further reduces a quantity of stacked layers of the touch control system. The formed integrated sensor is configured to sense a touch control instruction from a finger on an AMOLED display screen. A function of the polarizer 22 is to change natural light into linearly polarized light. The TX circuit 25 is configured to transmit a scan signal sent by a touch control integrated circuit (IC) sending unit, and the RX circuit 26 is configured to transmit a scan signal received by a touch control IC receiving unit. The TFT backplane 24 includes a pixel circuit, and circuits on two sides of the pixel circuit may be further subdivided into a scan circuit, a light emission control circuit, and the like. That is, the TFT backplane 24 includes a large quantity of transistors, lines, OLEDs, and the like. The TX circuit 25 and the RX circuit 26 may be disposed on the TFT backplane 24 in the following two disposing manners.

Figure 3:
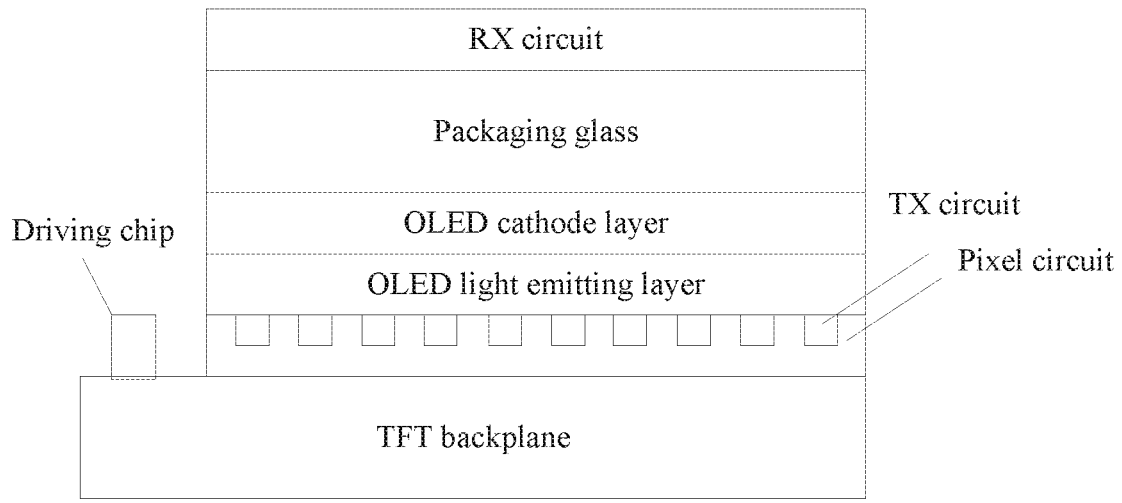
FIG. 3 is a schematic structural diagram of circuits of a second type of touch control system in an active matrix light emitting diode panel according to an embodiment of the present disclosure.

In a first manner, referring to FIG. 3, the TX circuit is routed in the pixel circuit on the TFT backplane in an intercalated manner, and the RX circuit is routed on an upper surface of the packaging glass in an intercalated manner.

Figure 4:
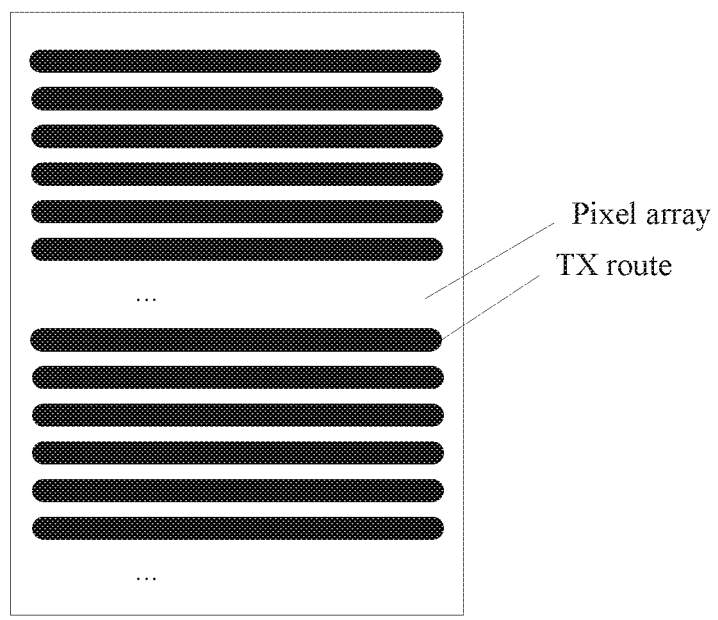
FIG. 4 is a schematic routing diagram of a TX circuit according to an embodiment of the present disclosure.
Figure 5:
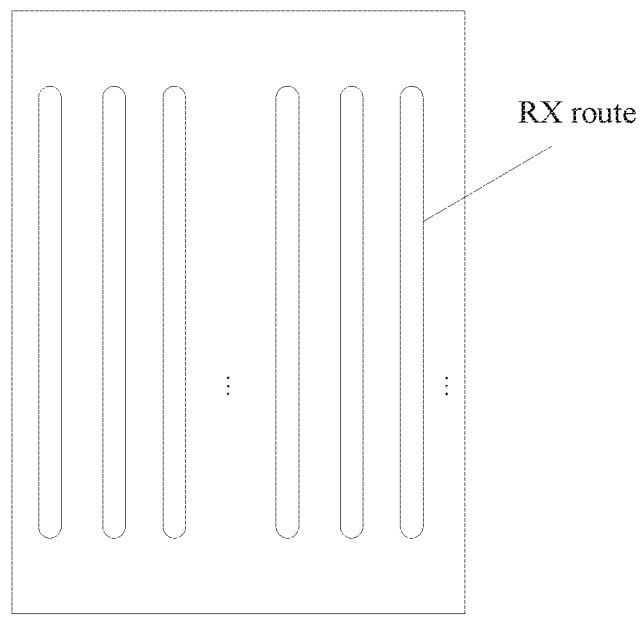
FIG. 5 is a schematic routing diagram of a first type of RX circuit according to an embodiment of the present disclosure.

That the TX circuit is routed in the pixel circuit on the TFT backplane in an intercalated manner means that the TX circuit is designed to be disposed in a spatial area in multiple rows of pixel circuits. Referring to FIG. 4, when the TX circuit is routed in the pixel circuit on the TFT backplane in an intercalated manner, multiple routes of the TX circuit divide a pixel array of the pixel circuit into multiple pixel array blocks. In FIG. 4, strip areas represent TX routes, and remaining areas represent the pixel array. The pixel circuit includes various electronic components. Therefore, the TFT backplane includes various protrusions. When the TX circuit is routed in the pixel circuit in an intercalated manner, the TX circuit may be routed in an area in which there is no protrusion in the pixel circuit, thereby reducing a thickness of the touch control system. That the RX circuit is routed on the upper surface of the packaging glass on the TFT backplane in an intercalated manner means that the RX circuit is designed to be disposed on the upper surface of the packaging glass. FIG. 5 shows routing of the RX circuit on the upper surface of the packaging glass.

In FIG. 3, an OLED cathode layer and an OLED light emitting layer are further included between the TFT backplane and the packaging glass. In addition, corresponding to the OLED cathode layer, an OLED anode layer (not shown) is further included. The OLED anode layer mainly consists of indium tin oxide (ITO). The OLED light emitting layer is sandwiched between the thin and transparent OLED anode layer and OLED cathode layer. An organic material is stimulated to emit light when a voltage injected to a hole of the OLED anode layer and an electron from the OLED anode layer are combined on the OLED light emitting layer.

Figure 6:
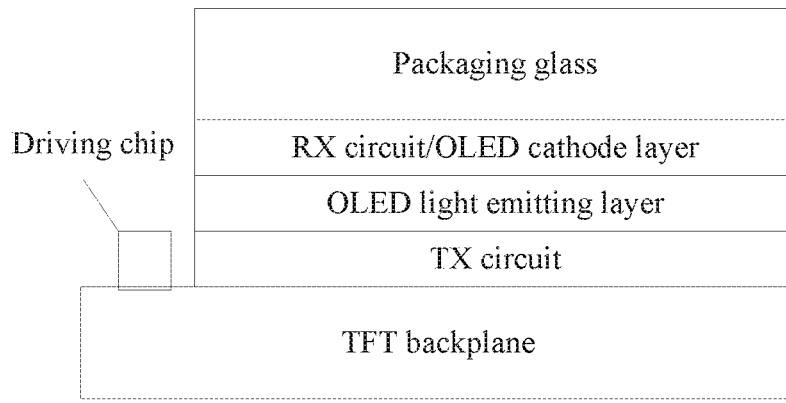
FIG. 6 is a schematic structural diagram of circuits of a third type of touch control system in an active matrix light emitting diode panel according to an embodiment of the present disclosure.
Figure 7:
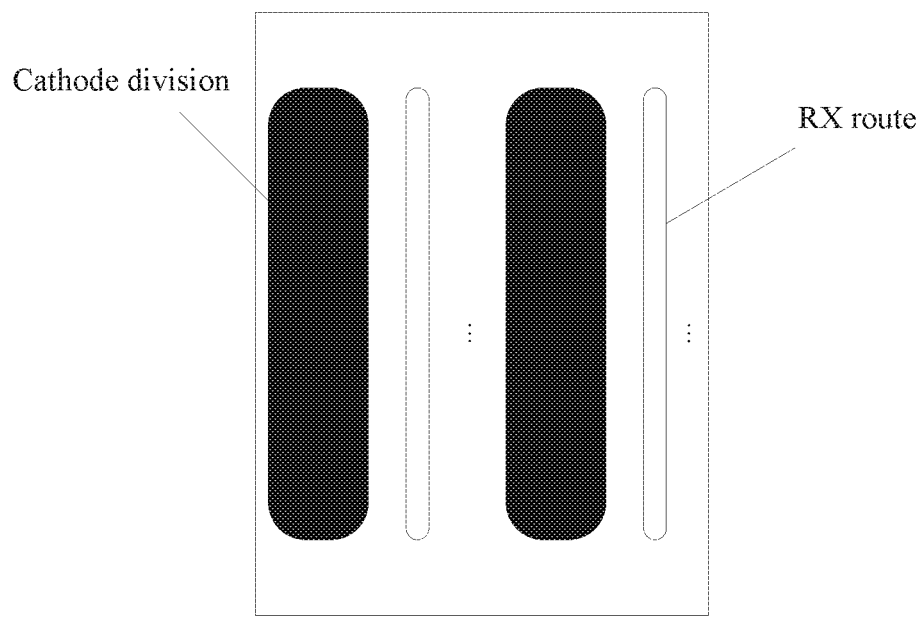
FIG. 7 is a schematic routing diagram of a second type of RX circuit according to an embodiment of the present disclosure.

In a second manner, referring to FIG. 6, the TX circuit is still routed in the pixel circuit (not shown) in an intercalated manner on TFT backplane, and the RX circuit is routed on a lower surface of the packaging glass in an intercalated manner. An OLED light emitting layer is further included between the TFT backplane and the packaging glass. An OLED cathode layer is further disposed on the lower surface of the packaging glass, and the RX circuit is routed in the OLED cathode layer in an intercalated manner. Therefore, a thickness of the touch control system is reduced. Referring to FIG. 7, the RX circuit is routed in the OLED cathode layer in an intercalated manner. Therefore, the RX circuit divides the OLED cathode layer into multiple blocks. In FIG. 7, a black strip area represents an OLED cathode layer block (i.e., cathode division) obtained through the division, and a colorless strip area represents an RX route.

In this embodiment of the present disclosure, a TX circuit and an RX circuit are disposed on a TFT backplane or packaging glass. Therefore, a quantity of stacked layers of a touch control system is reduced. This reduces a thickness of the touch control system, thereby achieving a thinner and lighter AMOLED display screen, and reducing a weight of a terminal product.

Figure 8:
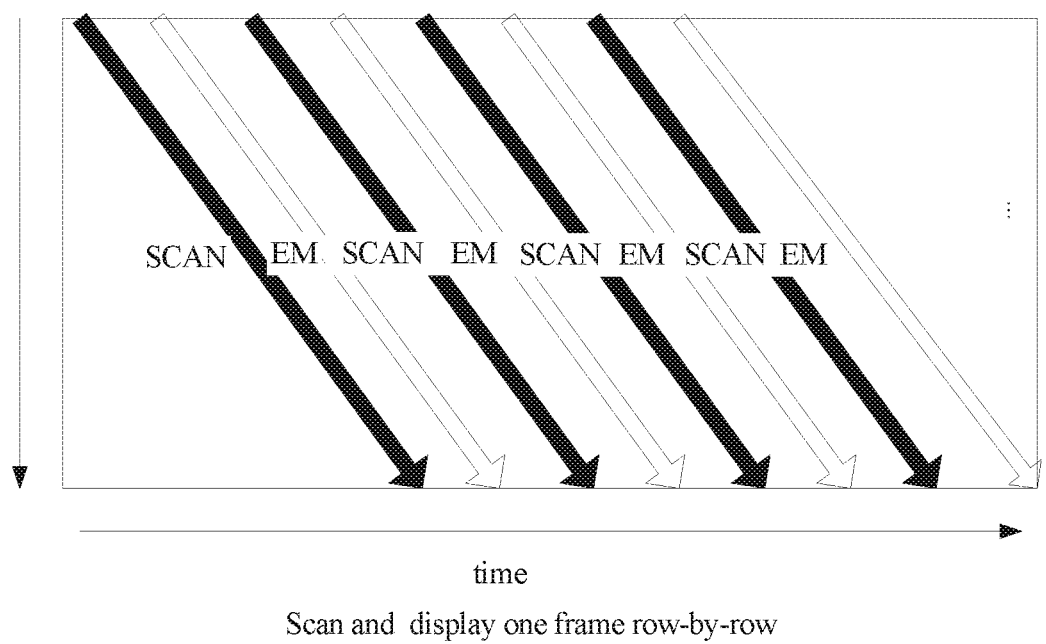
FIG. 8 is a schematic diagram of a first type of display driving according to an embodiment of the present disclosure.

It should be noted that, currently, a display driving manner generally used in an AMOLED display screen is a manner of row-by-row scan and row-by-row display. Row-by-row scan means that each frame of image is formed by means of continuous scanning row by row starting from the first row in an upper left corner or upper right corner on the screen. That is, after a scan signal (designated as SCAN in FIG. 8) controls the scan circuit to scan a row, a light emission control signal (designated as EM in FIG. 8) controls the light emission control circuit to display the row. Both the scan circuit and the light emission control circuit consist of a TFT and an OLED. The scan signal and the light emission control signal are used to control on/off of the TFTs to control, by means of on/off of the TFTs, the scan circuit to implement a scan function and the light emission control circuit to implement light emission control of the pixel circuit. Referring to a schematic diagram of display driving shown in FIG. 8, a horizontal axis represents time, and a vertical axis represents a quantity of pixels. For one frame of image, one row is displayed immediately after being scanned.

Figure 9:
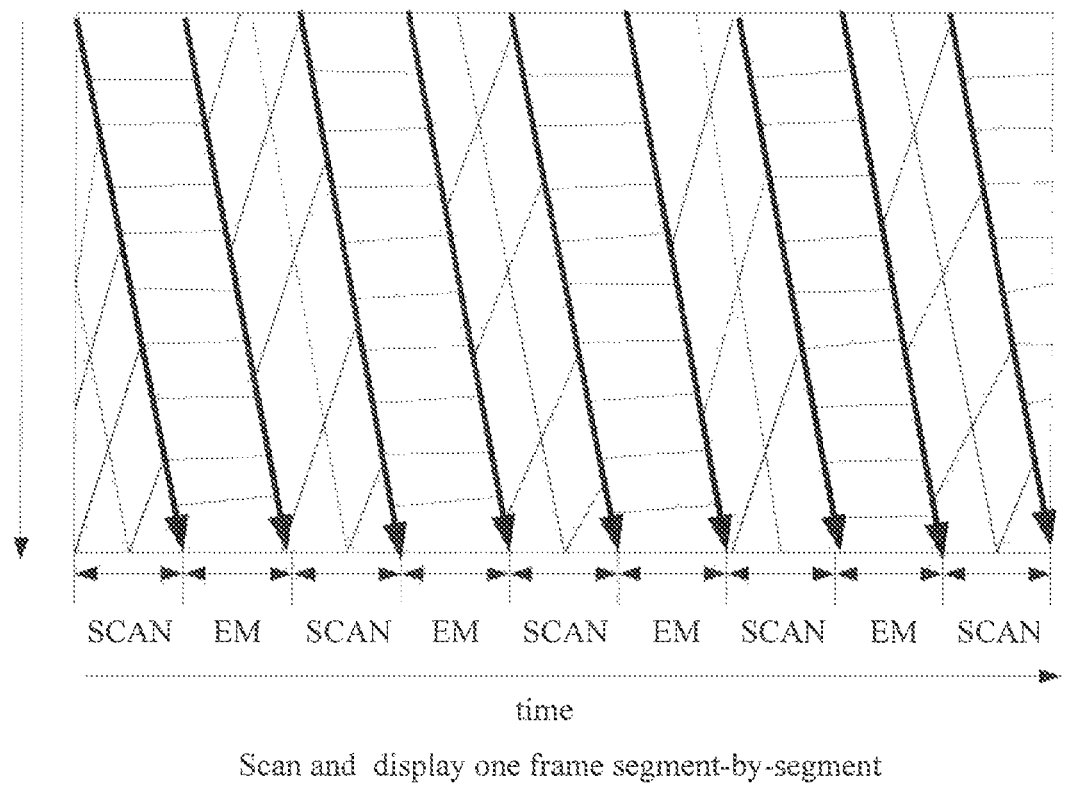
FIG. 9 is a schematic diagram of a second type of display driving according to an embodiment of the present disclosure.

In the display driving manner of row-by-row scan and row-by-row display, a touch control response time (i.e., touch panel (TP) sensing time) is relatively long, but total duration allocated to one frame is relatively fixed. As a result, scan and display times are insufficient, affecting display quality of a terminal. The touch control response time refers to a difference between a time when a TX signal is sent and a time when an RX signal is received. A longer touch control response time causes a lower report rate and a shorter time for display (IN-CELL structure), affecting picture quality. The report rate refers to a quantity of times of reporting touch point information per second. A higher report rate means that a touch track of a user can be more authentically restored. To avoid a defect of deteriorated display quality caused by insufficient scan and display times, referring to FIG. 9, an embodiment of the present disclosure provides a display driving manner of segment-by-segment scan and segment-by-segment display. A specific process is as follows.

In a display driving process, for any frame of image, a scan circuit is driven, using a scan signal line to scan multiple rows of the any frame of image in sequence, and a light emission control circuit is driven, using a light emission control signal line to display the scanned multiple rows. Multiple rows mean that after the scan circuit completes scanning, driven using the scan signal line, a row, the row is not displayed immediately, but instead, the scan circuit continues the scan. When a quantity of scanned rows reaches a preset quantity, the multiple rows scanned in this round are displayed together. The preset quantity may be 30, 40, 50, or the like. This embodiment of the present disclosure does not limit a size of preset data.

In addition, when the scan circuit is driven, using the scan signal line to scan multiple rows of the any frame of image in sequence, the following manner may be used for implementation. The scan circuit is controlled, using the scan signal line to scan the multiple rows of the any frame of image in sequence according to a preset direction. The preset direction may be from left to right, or from right to left. This embodiment of the present disclosure sets no specific limitation thereto.

Using the driving manner of segment-by-segment scan and segment-by-segment display, a touch control response time falls within a scan time of the scan circuit or a light emission control time of the light emission control circuit. That is, the touch control response time overlaps with the scan time or the light emission control time, thereby converting serial operations into parallel operations. A TP sensing action is completed in the light emission or scan time. This shortens the touch control response time, thereby ensuring a sufficient scan time and display time and ensuring picture display quality.

Using a 1920*1080 (row*column) display component and a 16*30 (row*column) touch control component as examples, a scan or light emission control time of the 1920*1080 display component covers original scan and response times (i.e., TP sensing time) corresponding to the 16*30 TP. In the original manner of row-by-row scan and row-by-row display, times are scan time of 1920 rows+display time of 1920 rows+touch control response time of 16 rows, and the operations are in serial. In the manner of segment-by-segment scan and segment-by-segment display provided in this embodiment of the present disclosure, times are scan time of 1920÷16=120 rows+display time of 120 rows+scan time of 120 rows+display time of 120 rows+ . . . scan time of 120 rows+display time of 120), where the scan time of 120 rows or the display time of 120 rows covers a TP sensing time.

In the touch control system provided in this embodiment of the present disclosure, a TX circuit and an RX circuit are disposed on a TFT backplane or packaging glass. Therefore, a quantity of stacked layers of the touch control system is reduced. This reduces a thickness of the touch control system, thereby achieving a thinner and lighter AMOLED display screen. In addition, using a driving manner of segment-by-segment scan and segment-by-segment display, a touch control response time is shortened, thereby ensuring a sufficient scan time and display time and ensuring picture display quality.

An embodiment of the present disclosure further provides an AMOLED panel, including the touch control system shown in the foregoing FIG. 2, a scan circuit, and a light emission control circuit. Beneficial effects of the AMOLED panel are the same as those of the touch control system provided in the foregoing embodiment of the present disclosure. Because the touch control system is described in detail in the foregoing embodiment, details are not described herein again.

In the AMOLED panel provided in this embodiment of the present disclosure, a TX circuit and an RX circuit are disposed on a TFT backplane or packaging glass. Therefore, a quantity of stacked layers of a touch control system is reduced. This reduces a thickness of the touch control system, thereby achieving a thinner and lighter AMOLED display screen, and reducing a weight of a terminal product. In addition, using a driving manner of segment-by-segment scan and segment-by-segment display, a touch control response time is shortened, thereby ensuring a sufficient scan time and display time and ensuring picture display quality.

Figure 10:
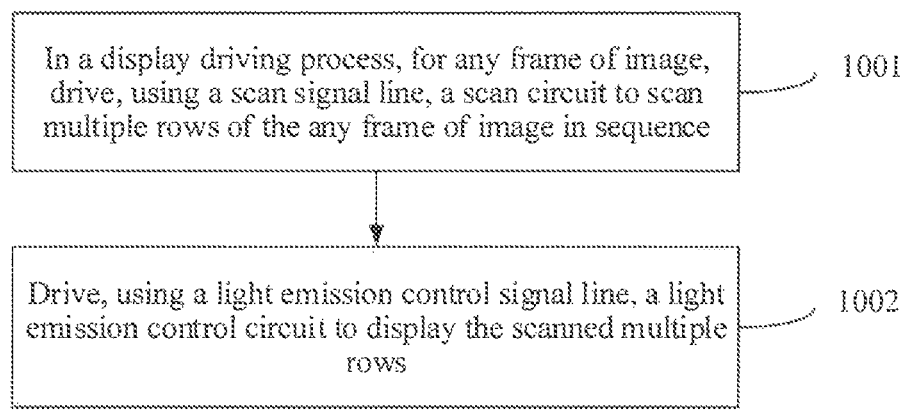
FIG. 10 is a flowchart of a display driving method according to an embodiment of the present disclosure.

FIG. 10 shows a display driving method according to an embodiment of the present disclosure. The display driving method may be applied to the AMOLED panel provided in the foregoing embodiment. Referring to FIG. 10, the driving method includes the following steps.

Step 1001: In a display driving process, for any frame of image, drive, using a scan signal line, a scan circuit to scan multiple rows of the any frame of image in sequence.

The driving, using a scan signal line, a scan circuit to scan multiple rows of the any frame of image in sequence includes controlling, using the scan signal line, the scan circuit to scan the multiple rows of the any frame of image in sequence according to a preset direction.

Step 1002: Drive, using a light emission control signal line, a light emission control circuit to display the scanned multiple rows.

A touch control response time falls within a scan time of the scan circuit or a light emission control time of the light emission control circuit.

According to the display driving method provided in this embodiment of the present disclosure, a display driving process, for any frame of image, a scan circuit is driven, using a scan signal line to scan multiple rows of the any frame of image in sequence, and then, a light emission control circuit is driven, using a light emission control signal line to display the scanned multiple rows. Because a driving manner of segment-by-segment scan and segment-by-segment display is used, a touch control response time is shortened, thereby ensuring a sufficient scan time and display time and ensuring picture display quality.

A person of ordinary skill in the art may understand that all or some of the steps of the embodiments may be implemented by hardware or a program instructing related hardware. The program may be stored in a computer-readable storage medium. The storage medium may include a read-only memory (ROM), a magnetic disk, or an optical disc.

The foregoing descriptions are merely example embodiments of the present disclosure, but are not intended to limit the present disclosure. Any modification, equivalent replacement, and improvement made without departing from the spirit and principle of the present disclosure shall fall within the protection scope of the present disclosure.

What is claimed is:

1. A touch system, comprising:
a glass cover;
a polarizer disposed beneath the glass cover;
a packaging glass disposed beneath the polarizer such that the polarizer is disposed between the glass cover and the packaging glass;
a thin film transistor (TFT) backplane disposed beneath the packaging glass such that the packaging glass is disposed between the polarizer and the TFT backplane;
a transmitter (TX) circuit located on the TFT backplane and configured to transmit a first scan signal to a touch control integrated circuit (IC);
a receiver (RX) circuit located on the packaging glass and configured to provide a second scan signal to the touch control IC;
a scan circuit configured to receive the first scan signal and, in response to receiving the first scan signal, scan first multiple rows of a frame of an image; and
a light emission control circuit configured to display each of the first multiple rows subsequent to the first multiple rows being scanned such that none of the first multiple rows are displayed until after all of the first multiple rows are scanned,
wherein the packaging glass, the TX circuit, and the RX circuit form a touch control sensor configured to perform a touch panel sensing action on second multiple rows of the touch panel within a scan time during which the scan circuit scans the first multiple rows and before the light emission control circuit displays the first multiple rows.

2. The touch system of claim 1, further comprising a pixel circuit on the TFT backplane, wherein the TX circuit is routed in the pixel circuit in an intercalated manner, and the RX circuit is routed on an upper surface of the packaging glass in another intercalated manner.

3. The touch system of claim 1, further comprising a pixel circuit on the TFT backplane, wherein the TX circuit is routed in the pixel circuit in an intercalated manner, and the RX circuit is routed on a lower surface of the packaging glass in another intercalated manner.

4. The touch system of claim 3, further comprising an organic light emitting diode (OLED) cathode layer, wherein the OLED cathode layer is located on the lower surface of the packaging glass, and the RX circuit is routed in the OLED cathode layer in the other intercalated manner.

5. The touch system of claim 2, wherein a plurality of routes of the TX circuit is configured to divide a pixel array of the pixel circuit into a plurality of pixel array blocks.

6. The touch system of claim 3, wherein a plurality of routes of the TX circuit is configured to divide a pixel array of the pixel circuit into a plurality of pixel array blocks.

7. The touch system of claim 4, wherein the RX circuit is configured to divide the OLED cathode layer into a plurality of blocks.

8. An active matrix organic light emitting diode (OLED) panel, comprising:
a touch system comprising:
a glass cover;
a polarizer disposed beneath the glass cover;
a packaging glass disposed beneath the polarizer such that the polarizer is disposed between the glass cover and the packaging glass;
a thin film transistor (TFT) backplane disposed beneath the packaging glass such that the packaging glass is disposed between the polarizer and the TFT backplane;
a transmitter (TX) circuit located on the TFT backplane and configured to transmit a first scan signal from a touch control integrated circuit (IC); and
a receiver (RX) circuit located on the packaging glass and configured to provide a second scan signal to the touch control IC;
a scan circuit coupled to the touch system and configured to receive the first scan signal and, in response to receiving the first scan signal, scan first multiple rows of a frame of an image; and
a light emission control circuit coupled to the scan circuit and the touch system and configured to display each of the first multiple rows subsequent to the first multiple rows being scanned such that none of the first multiple rows are displayed until after all of the first multiple rows are scanned,
wherein the packaging glass, the TX circuit, and the RX circuit form a touch control sensor configured to perform a touch panel sensing action on second multiple rows of the touch panel within a scan time during which the scan circuit scans the first multiple rows and before the light emission control circuit displays the first multiple rows.

9. The active matrix OLED panel of claim 8, wherein the touch system further comprises a pixel circuit on the TFT backplane, the TX circuit is routed in the pixel circuit in an intercalated manner, and the RX circuit is routed on an upper surface of the packaging glass in another intercalated manner.

10. The active matrix OLED panel of claim 8, wherein the touch system further comprises a pixel circuit on the TFT backplane, the TX circuit is routed in the pixel circuit in an intercalated manner, and the RX circuit is routed on a lower surface of the packaging glass in another intercalated manner.

11. The active matrix OLED panel of claim 10, wherein the touch system further comprises an OLED cathode layer, the OLED cathode layer is located on the lower surface of the packaging glass, and the RX circuit is routed in the OLED cathode layer in the other intercalated manner.

12. The active matrix OLED panel of claim 9, wherein the TX circuit includes a plurality of routes configured to divide a pixel array of the pixel circuit into a plurality of pixel array blocks.

13. The active matrix OLED panel of claim 10, wherein the TX circuit includes a plurality of routes configured to divide a pixel array of the pixel circuit into a plurality of pixel array blocks.

14. The active matrix OLED panel of claim 11, wherein the RX circuit is configured to divide the OLED cathode layer into a plurality of blocks.

15. A display driving method applied to an active matrix organic light emitting diode (OLED) panel, the method comprising:
   driving, using a scan signal line in a display driving process for any frame of an image, a scan circuit to scan a first plurality of rows of the any frame of the image in sequence;
   subsequent to driving the scan circuit to scan the first plurality of rows, driving, using a light emission control signal line, a light emission control circuit to display the first plurality of rows such that none of the first plurality of rows are displayed until all of the first plurality of rows are scanned; and
   performing a touch panel sensing action on a second plurality of rows of the touch panel within a scan time during which the scan circuit scans the first plurality of rows and before driving the light emission control circuit to display the first plurality of rows.

16. The display driving method of claim 15, wherein driving the scan circuit to scan the plurality of rows of the any frame of the image in sequence comprises controlling, using the scan signal line, the scan circuit to scan the plurality of rows of the any frame of the image in sequence according to a preset direction.

17. The display driving method of claim 15, wherein a touch response time falls within a scan time of the scan circuit.

18. The display driving method of claim 15, wherein a touch response time falls within an emissive time of the light emission control circuit.

19. The display driving method of claim 16, wherein a number of the plurality of rows is greater than a number of rows used for touch control, and a touch response time falls within a scan time of the scan circuit, and wherein the touch response time corresponds to an amount of time between when a TX signal is sent and when an RX signal is received.

20. The display driving method of claim 16, wherein a touch response time falls within an emissive time of the light emission control circuit.

* * * * *